United States Patent
Murakami

(10) Patent No.: US 10,978,162 B2
(45) Date of Patent: Apr. 13, 2021

(54) METHOD AND SEMICONDUCTOR DEVICE FOR PROTECTING A SEMICONDUCTOR INTEGRATED CIRCUIT FROM REVERSE ENGINEERING

(71) Applicant: Winbond Electronics Corp., Taichung (TW)

(72) Inventor: Hiroki Murakami, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/800,369

(22) Filed: Feb. 25, 2020

(65) Prior Publication Data
US 2020/0273526 A1    Aug. 27, 2020

(30) Foreign Application Priority Data
Feb. 25, 2019  (JP) ............................. JP2019-031347

(51) Int. Cl.
*G11C 16/22*  (2006.01)
*H01L 23/00*  (2006.01)

(52) U.S. Cl.
CPC .......... *G11C 16/225* (2013.01); *H01L 23/576* (2013.01)

(58) Field of Classification Search
None
See application file for complete search history.

(56) References Cited

U.S. PATENT DOCUMENTS

| 2004/0093530 A1 | 5/2004 | Watts | |
|---|---|---|---|
| 2010/0025479 A1* | 2/2010 | Bartley | G06F 21/87 |
| | | | 235/492 |
| 2018/0302095 A1* | 10/2018 | Iyengar | H01L 29/80 |

FOREIGN PATENT DOCUMENTS

| CN | 102056385 A | 5/2011 |
|---|---|---|
| CN | 102610278 B | 11/2014 |
| CN | 105229654 B | 2/2019 |
| JP | 2003158185 A | 5/2003 |
| JP | 2010118688 A | 5/2010 |
| TW | 200737670 A | 10/2007 |
| TW | 200805559 A | 1/2008 |

OTHER PUBLICATIONS

Office Action dated Jul. 30, 2020 in TW Application No. 108141155.

* cited by examiner

*Primary Examiner* — James G Norman
(74) *Attorney, Agent, or Firm* — Muncy, Geissler, Olds & Lowe, P.C.

(57) ABSTRACT

A protection method is provided to make it difficult to reverse engineer operational information. The present invention provides a protection method for preventing reverse engineering, including: generating an expected value during normal operation; monitoring voltage waveforms at monitoring points of the semiconductor integrated circuit; comparing a measured value generated in the monitored voltage waveforms with the expected value; determining whether reverse engineering is taking place or not based on comparison results; and when reverse engineering is taking place, controlling the semiconductor integrated circuit to run in a protection mode, which different from its normal operation.

12 Claims, 5 Drawing Sheets

| power voltage Vcc | | operating temperature Ta | |
|---|---|---|---|
| Vcc≦V1 | α1 | Ta≦T1 | β1 |
| V1<Vcc≦V2 | α2 | T1<Ta≦T2 | β2 |
| V2<Vcc≦V3 | α3 | T2<Ta≦T3 | β3 |
| V4<Vcc | α4 | T4<Ta | β4 |

(A) without RE protection function (B) with RE protection function

METHOD AND SEMICONDUCTOR DEVICE FOR PROTECTING A SEMICONDUCTOR INTEGRATED CIRCUIT FROM REVERSE ENGINEERING

CROSS REFERENCE TO RELATED APPLICATIONS

This application claims priority to and the benefit of Japan Application 2019-031347, filed on Feb. 25, 2019, the entirety of which is incorporated by reference herein.

FIELD OF THE INVENTION

The invention relates to a method for protecting a semiconductor integrated circuit from reverse engineering.

DESCRIPTION OF THE RELATED ART

The internal structure and the internal operation of semiconductor integrated circuits such as a flash memory contains useful information that should be protected as confidential information. However, that information can be obtained by a third party by reverse engineering the semiconductor wafer. A countermeasure can be taken against reverse engineering by focusing on the integrated circuit structure. For example, in order to conceal the connection information of the wiring, a dummy circuit can be arranged on the upper layer of the multilayer wiring, making it difficult to analyze the real circuit structure formed on the lower layer. In addition, a metal connection line with the same shape as the real via metal contact line may be formed, making it difficult for the third party to identify whether there is a connective function between the two metal connection lines when performing reverse engineering (Patent Document 1). In addition, an example is disclosed in which a conductive block mask is changed and the artificial edge of a silicon layer is used so that the device does not show its real structure, but rather is misleading (Patent Document 2).

PRIOR ART DOCUMENT

Patent Document 1 (Japan Application JP2003-158185)
Patent Document 2 (Japan Application JP2010-118688)

BRIEF SUMMARY OF THE INVENTION

Problems to be Solved by the Present Invention

As shown in Patent Documents 1 and 2, the structure of semiconductor circuits may be changed or added to in current semiconductor integrated circuits or in countermeasures against reverse engineering of semiconductor circuits. For the operation information of semiconductor integrated circuits, there is still no perfect measure. In recent years, for example, in order to improve the characteristics of memory cells in flash memory, such as the narrow distribution of thresholds or interference suppression, complex actions may be performed on both the read and write actions (such as focusing on the slope of the voltage or the step width). Therefore, engineers involved in equipment manufacturing spend most of their time performing complicated operations in order to evaluate or improve storage units. These complicated operations require technical know-how on the part of equipment manufacturers. By probing the inside of a semiconductor wafer (metal wiring), these complicated operations are easily revealed, and the internal operation may be discerned.

The present invention aims to solve such problems, and aims to provide a protection method and a semiconductor device to make reverse engineering of operation information difficult.

Ways to Solve the Problems

The method for protecting a semiconductor integrated circuit from reverse engineering according to the present invention includes the following steps: monitoring a voltage waveform at a predetermined monitoring point of the semiconductor integrated circuit; determining whether the monitored voltage waveform equals an expected value during normal operation; and controlling the semiconductor integrated circuit to operate other than in a normal operation when the monitored voltage waveform does not equal the expected value.

The semiconductor device of the present invention has a function of protecting a semiconductor integrated circuit from reverse engineering including: a generator device, configured to generate an expected value from a voltage waveform obtained at a monitoring point during normal operation of the semiconductor integrated circuits; a monitoring device, configured to monitor the voltage waveform at the monitoring point; a determining device, configured to determine whether the monitored voltage waveform equals the expected value during normal operation according to the monitoring device; and a control device, configured to control the semiconductor integrated circuit to operate other than in a normal operation when the determining device determines that the monitored voltage waveform does not reach the expected value.

Invention Effect

Based on the present invention, a voltage waveform from a predetermined point for monitoring a semiconductor integrated circuit is monitored, and when the monitored voltage waveform does not equal the expected value during normal operation, the semiconductor integrated circuit operates other than in a normal operation. Therefore, it is possible to conceal information related to the operation during normal operation and prevent such information from being easily analyzed during reverse engineering.

BRIEF DESCRIPTION OF THE DRAWINGS

The invention can be more fully understood by reading the subsequent detailed description with references made to the accompanying figures. It should be understood that the figures are not drawn to scale in accordance with standard practice in the industry. In fact, it is allowed to arbitrarily enlarge or reduce the size of components for clear illustration.

DETAILED DESCRIPTION OF THE INVENTION

Next, embodiments of the present invention are described in detail with reference to the figures. The present invention is equipped with a function of protecting a semiconductor integrated circuit from reverse engineering. The semiconductor integrated circuit as a protection target is not particularly limited, such as a flash memory, a variable resistance memory, a non-volatile memory such as a magnetic memory, a volatile memory such as a dynamic random access memory (DRAM) or a static random access memory (SRAM), a central processing unit (CPU), digital signal processor (DSP), a logic, etc. In the following embodiments, a NAND flash memory is taken as an example for description.

Figure 1:
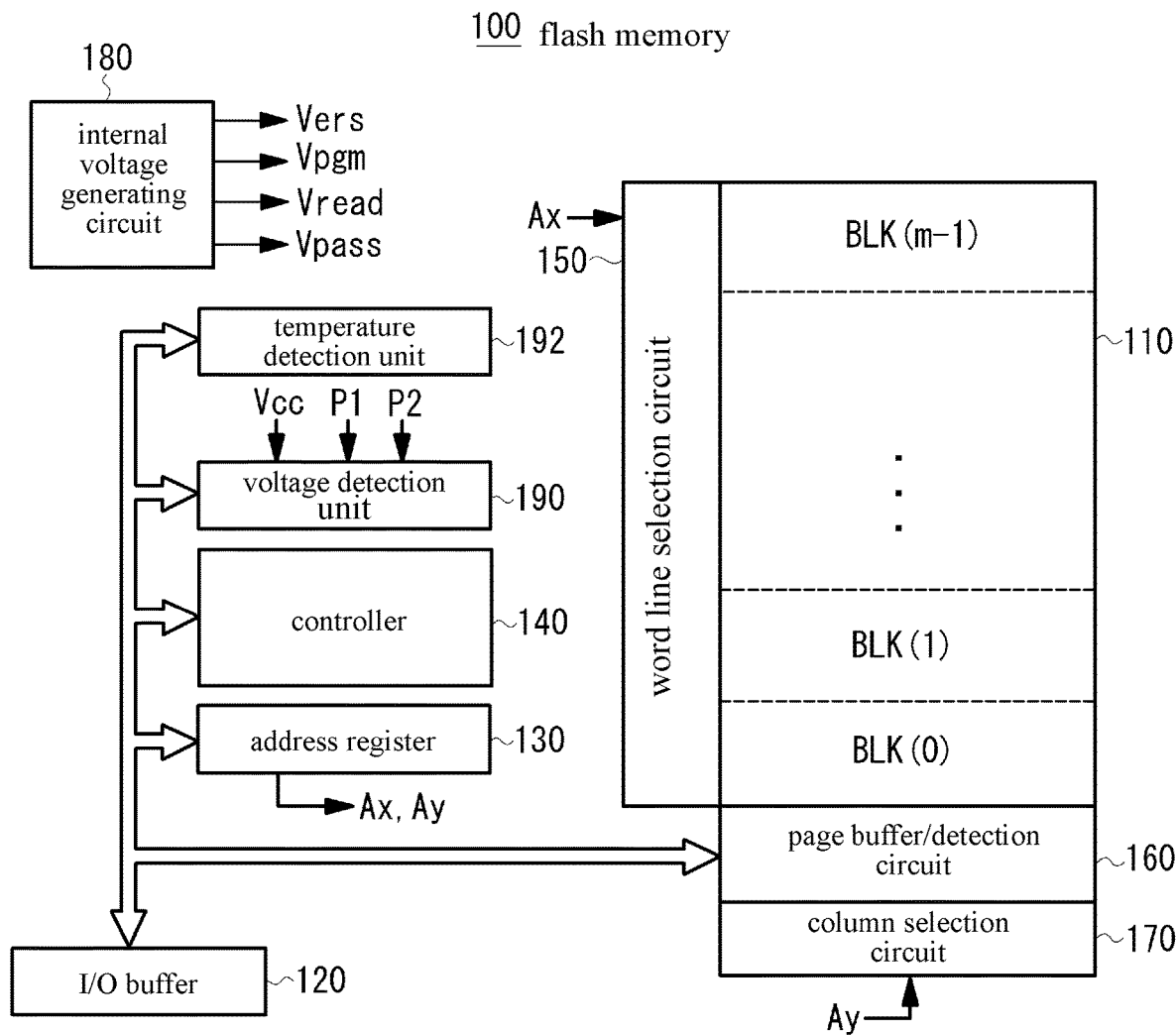
FIG. 1 shows a block diagram of a structure of a flash memory in accordance with some embodiments of the disclosure.

FIG. 1 is a block diagram of a NAND flash memory having a reverse engineering protection function in accordance with some embodiments of the disclosure. A flash memory 100 of the embodiment has a memory array 110 having a plurality of blocks BLK(0), BLK(1), ..., BLK (m−1), and each block includes a plurality of NAND strings. The flash memory 100 further includes an I/O buffer 120 connected to external I/O terminals; an address register, which receives address data from the I/O buffer 120; a controller 140, which receives command data, etc. from the I/O buffer 120, and controls each unit; a word line selection circuit 150 decodes a row address information Ax from the address register 130 and selects blocks and word lines based on a decoded result; a page buffer/detection circuit 160, which holds the data read from the page selected by the word line selection circuit 150, and holds an input data that should be programmed in the selected page; a column selection circuit 170, which decodes a column address information Ay from the address register 130 and selects the data of the column address in the page buffer/detection circuit 160 based on the decoding result; an internal voltage generating circuit 180, which generates various necessary voltages for reading data, programming, and erasing (a write voltage Vpgm, a pass voltage Vpass, a read pass voltage Vread, and an erase voltage Vers, etc.); a voltage detection unit 190, which detects a power voltage Vcc supplied from the outside or a voltage at a predetermined monitoring point P1 or P2; and a temperature detection unit 192, which detects an operating temperature of the flash memory.

The controller 140 is composed of hardware, software, or the combination thereof. For example, the controller 140 may be composed of a microcontroller including a read only memory (ROM)/a random access memory (RAM) and a central processing unit (CPU), a microprocessor including the read only memory (ROM)/the random access memory (RAM) and the central processing unit (CPU), or a state machine including the read only memory (ROM)/the random access memory (RAM) and the central processing unit (CPU). The controller 140 in the embodiment also controls certain functions such as read actions, programming actions, and erasing actions, and has a reverse engineering protection function for protecting the flash memory from reverse engineering.

Figure 2:
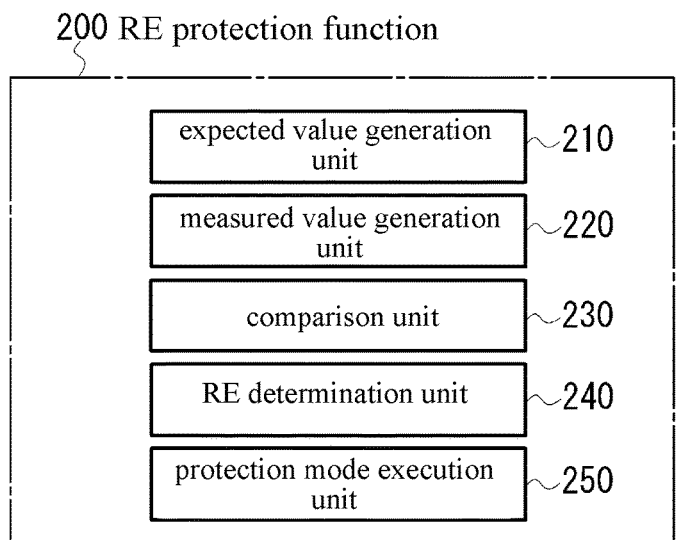
FIG. 2 shows a block diagram of a reverse engineering protection function structure in accordance with a first embodiment of the disclosure.

FIG. 2 shows a block diagram of a structure of a reverse engineering (RE) protection function 200 in accordance with the embodiment of the disclosure. The RE protection function 200 includes an expected-value generation-unit 210, a measured value generation unit 220, a comparison unit 230, an RE determination unit 240, and a protection mode execution unit 250. The RE protection function 200 is composed of hardware, software, or the combination thereof.

Figures 3, 4:
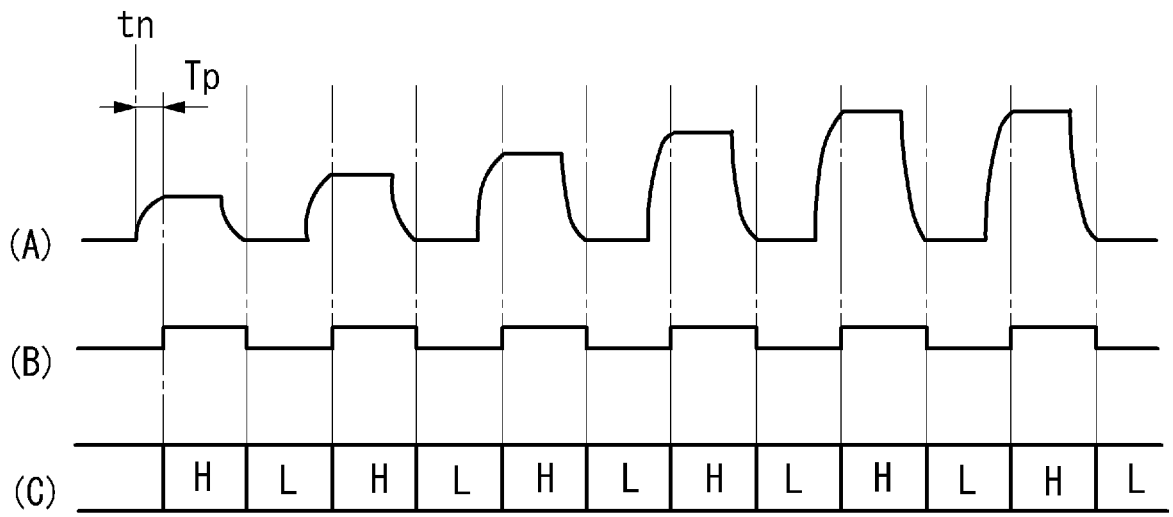
In FIG. 3, (A) shows a voltage waveform of an internal circuit during normal operation, (B) shows a pulse waveform generated from the voltage waveform in (A), and (C) shows a schematic diagram of related data of the pulse waveform.
FIG. 4 shows a schematic diagram of defining a relationship between a power voltage Vcc, an operating temperature Ta, and time interval Tp in accordance with the first embodiment of the disclosure.

The expected-value generation-unit 210 generates an expected value of a voltage waveform which is associated with the normal operation of the flash memory. The expected value is generated in accordance with the definition of the operation time during normal operation. FIG. 3 shows one example. FIG. 3(A) is a voltage waveform of an internal circuit during normal operation, for example, the voltage waveform of a signal applied to a certain wiring or a certain place when a programming operation or a reading operation is performed. During normal operation (when the probe is not in contact with the semiconductor wafer or the conductive sheet), the voltage waveform of the internal circuit that is rising with the slope of the time constant as designed is charged to the target voltage, and then discharged to the GND level. The voltage detection unit 190 detects the rising peak voltage and the falling GND level of the monitoring points P1 and P2 of the internal circuit during normal operation as shown in FIG. 3(A), and provides the detection result to the expected-value generation-unit 210. The expected-value generation-unit 210 generates a pulse waveform as shown in FIG. 3(B) from the detection result. Such the pulse waveform is used in a processing circuit associated with the normal operation as shown in FIG. 3(C). Therefore, the generation of the pulse waveform may be performed by the expected-value generation-unit 210, or may be performed by another circuit that requires such a pulse signal.

The expected-value generation-unit 210 generates an expected value based on the voltage waveforms of the monitoring points P1 and P2 during normal operation or a pulse waveform obtained from the voltage waveform. The expected value at least includes time interval Tp which is from a reference time tn to the time that the pulse waveform rises. The reference time tn is defined in advance. For example, when the voltage waveform of the internal circuit is a programming voltage, the reference time tn is defined as a time point when the programming voltage is applied to the selected word line. Alternatively, when the voltage waveform of the internal circuit is a read voltage, the reference time tn is defined as a time point when the read voltage is applied to the selected word line. The time interval Tp is from the reference time tn to the time that the pulse waveform rises. For example, when the controller 140 operates synchronously with the clock signal, Tp can also be expressed as the number of pulses of the clock signals. The expected-value generation-unit 210 stores the expected value in a non-volatile memory (such as a memory array). The expected value reflects the engineering error of each wafer according to the wafer test results and so on. The expected value is used as the original reference value (standard value). After the power is turned on, the expected value is read by non-volatile memory, loaded into a cache memory or a register, and read by the cache memory or the register when the expected value is needed.

The time interval Tp from the reference time tn to the time that the pulse waveform rises is a function of the rising slope of the voltage waveform, but the rising slope is affected by the state of the power voltage Vcc or the operating temperature of the internal circuit. For example, the lower the power voltage Vcc is, the slower the slope is; the higher the power voltage Vcc is, the steeper the slope is. Therefore, in some embodiments, the expected-value generation-unit 210 feeds back variations of the power voltage Vcc and the operating temperature Ta to the time interval Tp from the reference time tn to the time that the pulse waveform rises. For example, the state of the power voltage Vcc and the relationship between the operating temperature Ta and the time interval Tp are prepared, and the relationship is well known as the table in FIG. 4. In the table in FIG. 4, correction values corresponding to the power voltage Vcc and correction values corresponding to the operating temperature Ta are set, and these correction values are used to correct the time interval Tp. When the expected-value generation-unit 210 compares the expected value with the measured value, that is, when reading the expected value from the non-volatile memory, refereeing to the table in FIG. 4, based on the voltage level of the power voltage Vcc detected by the voltage detection unit 190 and the temperature detected by the temperature detection unit 192, the time interval Tp from the reference time tn to the time that the pulse waveform rises is corrected.

The measured value generation unit 220 generates an expected value based on a pulse waveform generated by the voltages (a peak voltage and a GND level) detected by the voltage detection unit 190 at the monitoring points P1 and P2. The monitoring points P1 and P2 are selected as points on the semiconductor wafer that can be contacted with a probe, and positions for electrical connection. Generally, the probe is in contact with an upper wiring layer or an electrode sheet of a multilayer wiring structure. However, it may be possible to remove the wiring layer or the insulating layer of the semiconductor wafer and contact the internal wiring layer or the conductive area in accordance with different situations. If it is a flash memory, since the read voltage or the programming voltage is applied to the global word line, and the pre-charge voltage is applied to the global bit line, it can be envisaged that the probe test (probing) is performed at the position electrically connected to the global word line or the global bit line. Therefore, the positions that can monitor the voltage or signal applied to the global word line or global bit line are selected as the monitoring points P1 and P2. In addition, although two monitoring points are selected in the example, one or three monitoring points may be selected.

Figure 5:
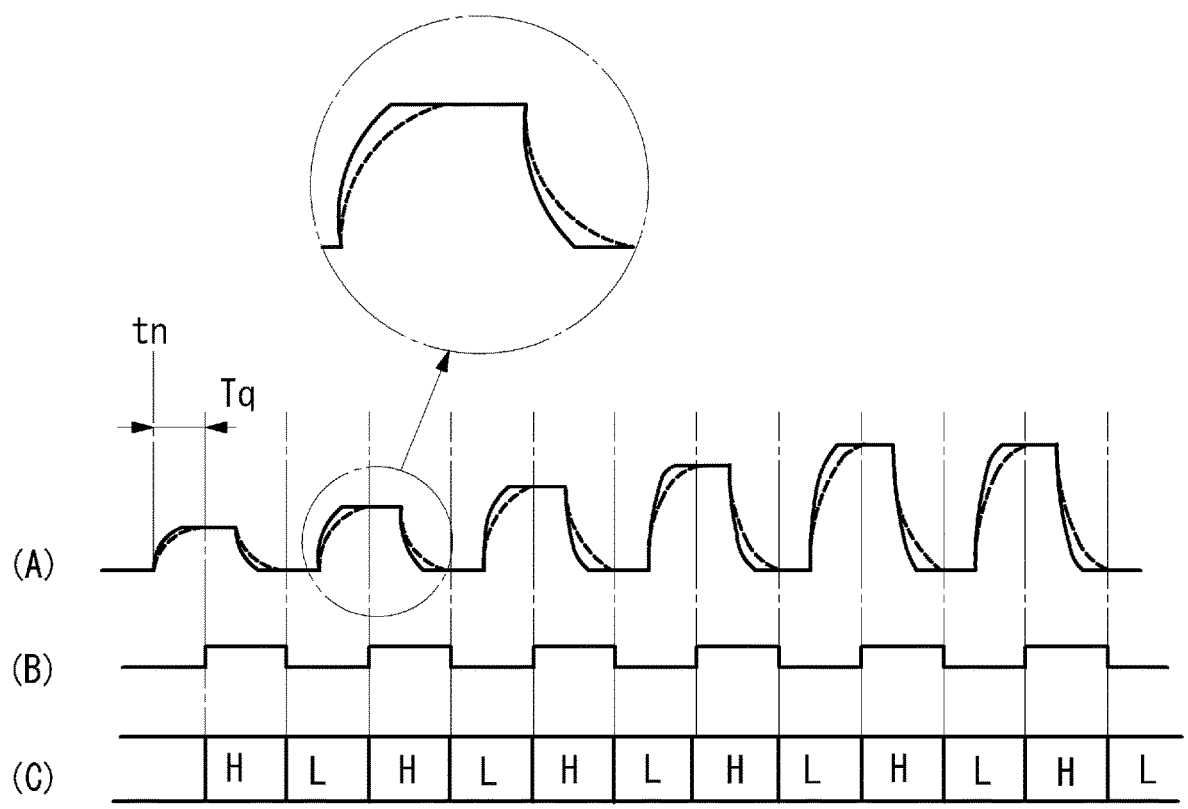
In FIG. 5, (A) shows a voltage waveform of the internal circuit during an abnormal operation, (B) is a pulse waveform generated from the voltage waveform in (A), and (C) is a schematic diagram of related data of the pulse waveform.

If a third party contacts the probe to the semiconductor wafer, the electrostatic capacitance of the probe will overlap to the contact point. In other words, RC constants of the monitoring points P1 and P2 to which the probe test point is electrically connected are increased. As a result, the slopes of the voltage waveforms at the monitoring points P1 and P2 become gradually increased and gradually decreased when compared to the slopes during normal operation. As shown in FIG. 5(A), the solid line is the voltage waveform at the monitoring points P1 (P2) during normal operation, and the dotted line is the voltage waveform at the monitoring point P1 (P2) during the probe test.

FIG. 5(B) is a pulse waveform generated from the voltage waveforms at the monitoring points P1 and P2 during the probe test. Because the pulse waveform during the probe test has a slower rising slope of the voltage waveform, the time interval Tq from the reference time tn to the time that the pulse waveform rises is longer than the time interval Tp during normal operation.

The comparison unit 230 compares the expected value generated by the expected-value generation-unit 210, that is, the time interval Tp from the reference time tn to the time that the pulse waveform rises, with the measured value generated by the measured value generation unit 220, that is, the time from the reference time tn to the time interval Tq that the pulse waveform rises. The time interval Tp is read from the non-volatile memory when the power is turned on as described above, and is expanded to the cache memory or the register. At this time, the comparison unit 230 may directly use the expected value kept in the cache memory or the register, or referring to the table shown in FIG. 4, the corrected expected value is used based on the detected voltage level of the power voltage Vcc and/or the operating temperature Ta.

The RE determination unit 240 receives the comparison result of the comparison unit 230 and determines whether reverse engineering is taking place. Specifically, the determination is Tq−Tp>Tm. Tm is an operating margin or an allowable range, and the time delay beyond Tm is considered as an artificial or intentional behavior, and it is determined that reverse engineering is taking place.

Figure 6:
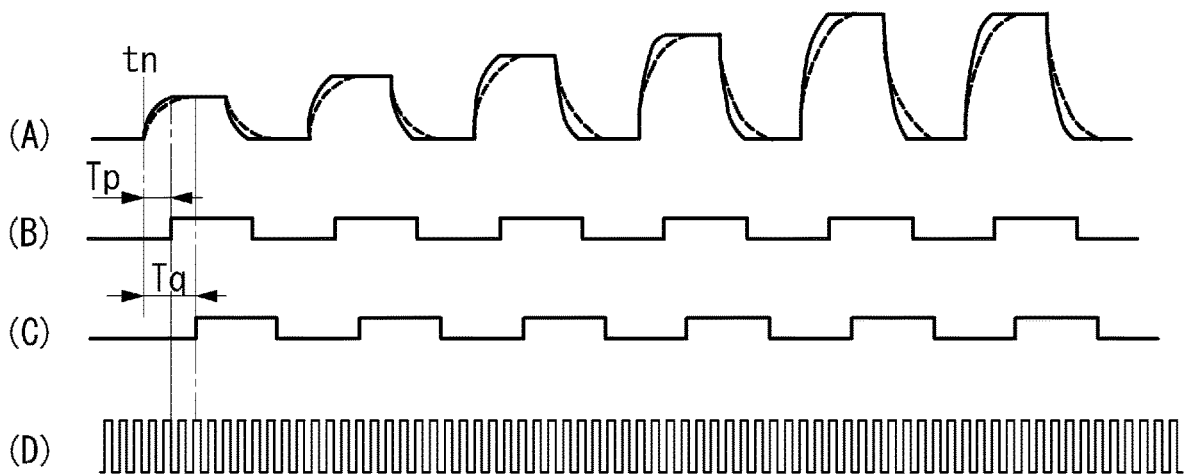
FIG. 6 shows an example of an RE determination unit in accordance with the first embodiment, (A) shows a voltage waveform of the internal circuit, (B) shows a normal operation pulse waveform generated from the voltage waveform, (C) shows a pulse waveform during reverse engineering generated from the voltage waveform, and (D) is a schematic diagram of a clock used by a controller.

FIG. 6 shows an operation example of the RE determination unit. FIG. 6(A) shows a voltage waveform (solid line) during normal operation and a voltage waveform (dotted line) during reverse engineering. FIG. 6(B) shows a pulse waveforms during normal operation, FIG. 6(C) shows a pulse waveform during reverse engineering, and FIG. 6(D) shows a clock used for the operation of the controller 140. The RE determination unit 240 detects a delay time of the time interval Tp−Tq. For example, when the difference between the time interval Tp and the time interval Tq is above a certain number of pulses, it is determined that reverse engineering is taking place. In addition, in order to improve the determination accuracy, the time interval Tp and the time interval Tq may be compared with respect to a plurality of pulse waveforms, and when it is detected that the delay time is equal to or greater than a predetermined number of pulses based on all or a certain ratio of the waveform comparisons, it is determined that reverse engineering is taking place.

When the RE determination unit 240 determines that reverse engineering is taking place, the protection mode execution unit 250 causes the flash memory to operate in a protection mode different from the normal operation, and conceals the real operation during normal operation. The protection mode execution unit 250 executes a dummy action (a fake action) prepared in advance, or stops the normal operation.

Figure 7:
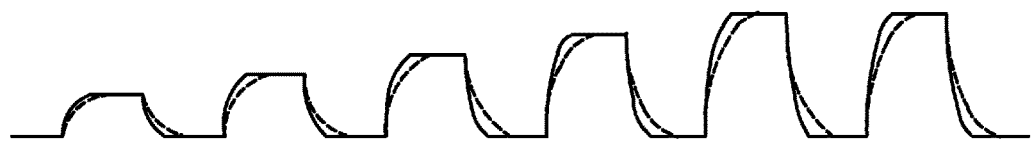
In FIGS. 7, (A) and (B) show schematic diagrams of a protection mode in accordance with the first embodiment of the disclosure.
Figure 7:
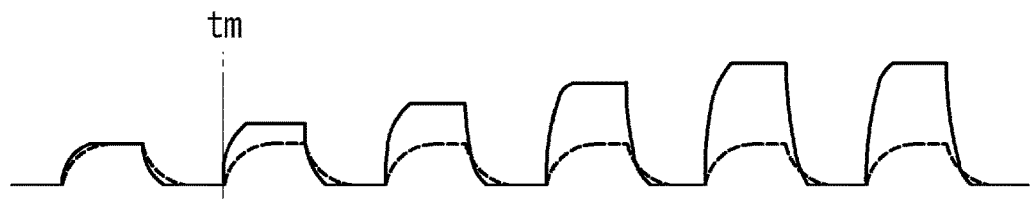

FIG. 7 shows an example of a protection mode. FIG. 7(A) shows a voltage waveform (dotted line) in the case where there is no protection function, and FIG. 7(B) shows a voltage waveform (dotted line) in the case where the embodiment of present invention has a protection function. It can be clearly seen from FIG. 7 that without the protection function, the voltage waveform during the probe test may follow the same voltage level as the voltage waveform during normal operation. Therefore, it is easy to infer the operation during normal operation. In contrast, when there is a protection function, the protection mode execution unit 250 enters the protection mode at time tm and operates the internal circuit under dummy conditions. The dummy conditions here allow the internal circuit to operate at a voltage level that is lower than the voltage level during normal operation. For this reason, a voltage level of the voltage waveform during the probe test becomes different from that of the voltage waveform during normal operation, so that a third party may recognize dummy actions.

Figure 8:
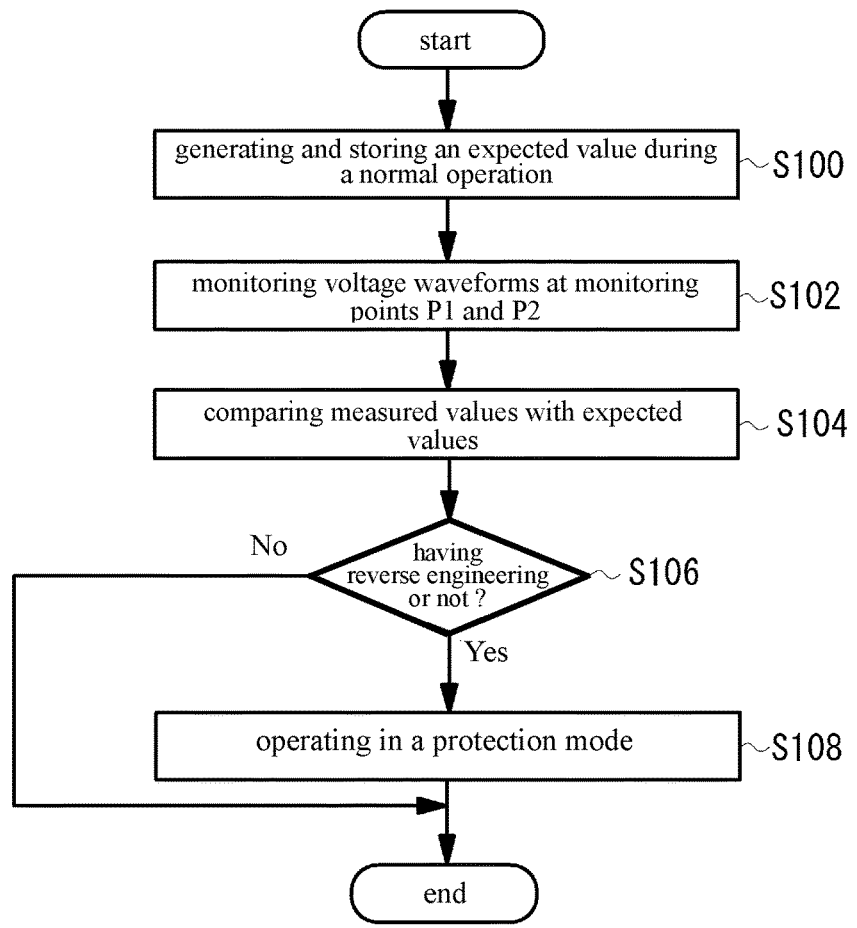
FIG. 8 shows a flow chart of a protection operation of reverse engineering in accordance with the first embodiment of the disclosure.

FIG. 8 shows an operation flow chart of a reverse engineering protection function of the embodiment of the present invention. First, in the semiconductor wafer manufacturing stage, that is, before the product is shipped, the expected-value generation-unit 210 generates an expected value during normal operation and stores the expected value in a non-volatile memory (for example, a memory array) (S100). The expected value during normal operation can be generated during various actions such as a read action, a programming action, and an erase action.

After the product is shipped, the measured value generation unit 220 monitors the voltage waveforms at the monitoring points P1 and P2 determined in advance (S102), generates the measured values from the voltage waveforms obtained at the monitoring points P1 and P2, and the comparison unit 230 compares the measured values with the expected values (S104). Here, when a plurality of the normal operation expected values such as a read action, a programming action, and an erase action are prepared, the expected value corresponding to the real operation is used. At this time, the expected value which is used may be read from the non-volatile memory without the power voltage or the temperature correction, the expected value may also be the expected value after correction corresponding to the detected voltage of the power voltage Vcc and/or the operating temperature Ta. The expected value used by the latter can further improve the accuracy of determining whether there is a probe test.

Next, the RE determination unit 240 determines whether reverse engineering is taking place based on the comparison result (S106). When the protection mode execution unit 250 determines that there is reverse engineering, the flash memory is operated in the protection mode (S108).

In the above embodiment, am example of generating the expected value (the time from the reference time to the time that the pulse waveform rises) during normal operation and storing the expected value is shown. However, if it is possible to measure the delay time (Tq−Tp) until the pulse waveform rises in reverse engineering, it is not necessary to store the expected value.

Figure 9:
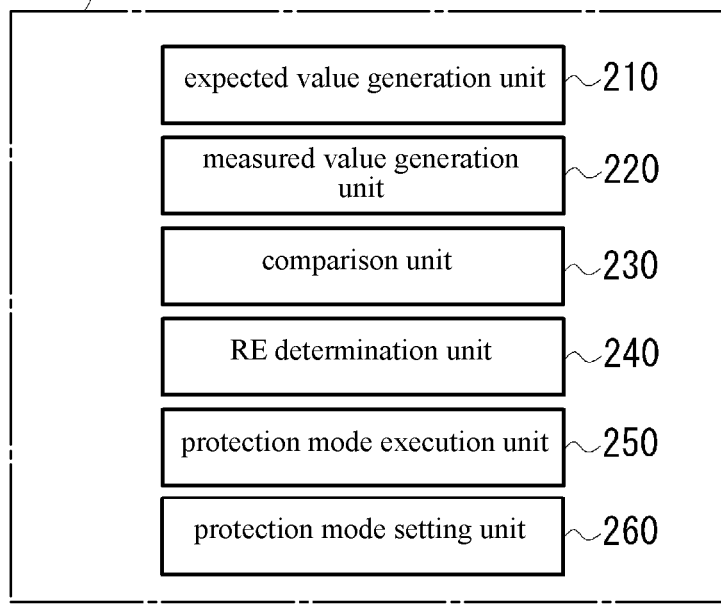
FIG. 9 shows a block diagram of a reverse engineering protection function structure in accordance with a second embodiment of the disclosure.

Next, a second embodiment of the present invention is described. FIG. 9 shows the a reverse engineering protection function 200A of the embodiment, and the same components as those in FIG. 2 are given the same reference numerals.

The second embodiment includes a protection mode setting unit 260 that sets whether the reverse engineering protection function 200A is enabled or disabled. The protection mode setting unit 260 sets the protection function to be enabled or disabled based on a user's input. For example, set the flag to "1" when the protection function is enabled, and set the flag to "0" when the protection function is disabled. The setting method is arbitrary, for example: a setting command can be inputted from a host terminal, or a specific voltage can be applied to a specific external I/O pin to set whether to enable or not. The protection mode execution unit 250 causes the flash memory to operate the protection mode, and conceals operations during normal operation only when the "enable" is set to the protection mode setting unit 260.

Figure 10:
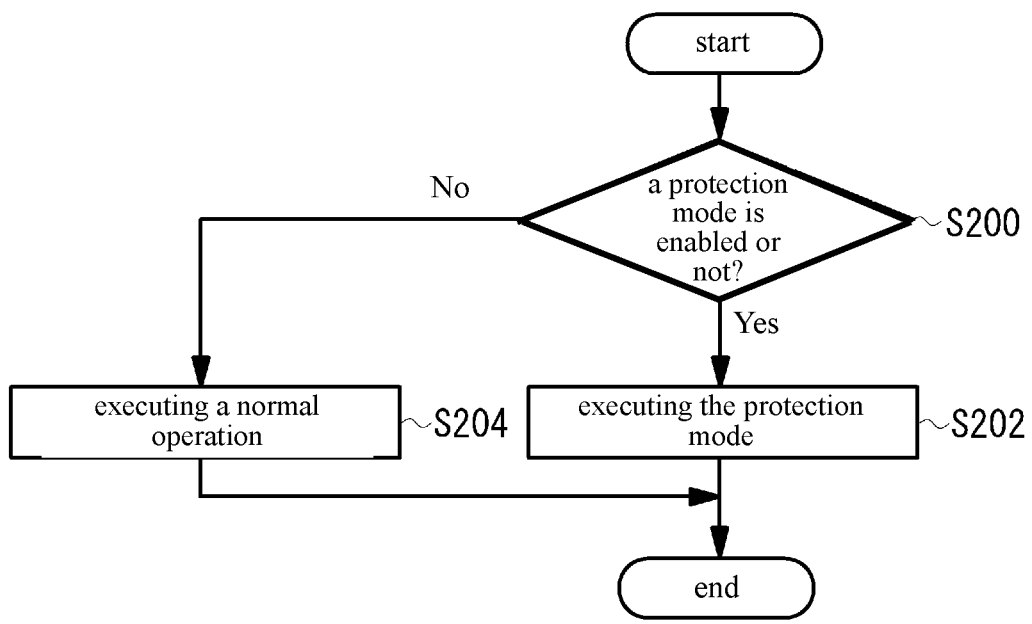
FIG. 10 shows a flow chart of a protection operation of reverse engineering in accordance with the second embodiment of the disclosure.

FIG. 10 is an operation flow chart of a reverse engineering protection function in accordance with the second embodiment. The protection mode execution unit 250 checks the setting of the protection mode setting unit 260 (S200). If the protection mode is set to be enabled, the protection mode is activated (S202) in accordance with the determination result of the RE determination unit 240 as described in the first embodiment. If the protection mode is set to be disabled, the protection mode is not activated but normal operation resumes (S204).

As described above, according to the embodiment, by setting whether to activate the protection mode, such as when the manufacturer of the flash memory itself performs a test on the semiconductor wafer using a test probe or the like, it is possible to confirm the real voltage waveform or the operational waveform.

Although the reverse engineering protection function of the flash memory is exemplified in the embodiments described above, it goes without saying that the present invention can also be applied to various semiconductor devices other than the flash memory. In addition, although the above example illustrates the operation waveforms in which the voltage gradually increases as shown in FIG. 3(A), etc., this is only one example, and in the case where the operation waveforms during normal operation change at a fixed voltage level, a dummy operation waveform such as a gradual increase in voltage or a gradual decrease in voltage can also be generated during a dummy operation. In addition, when the voltage is a gradually decreasing operation waveform during normal operation, the dummy operation waveform that causes the voltage to change at a fixed voltage level can also be generated during the dummy operation.

The ordinal in the specification and the claims of the present invention, such as "first", "second", "third", etc., has no sequential relationship, and is just for distinguishing between two different components with the same name. In the specification of the present invention, the word "couple" refers to any kind of direct or indirect electronic connection. The present invention is disclosed in the preferred embodiments as described above, however, the breadth and scope of the present invention should not be limited by any of the embodiments described above. Persons skilled in the art can make small changes and retouches without departing from the spirit and scope of the invention. The scope of the invention should be defined in accordance with the following claims and their equivalents.

What is claimed is:

1. A protection method for protecting a semiconductor integrated circuit from reverse engineering, comprising the following steps:

monitoring a voltage waveform at a predetermined monitoring point of the semiconductor integrated circuit;

determining whether the monitored voltage waveform equals an expected value during normal operation; and controlling the semiconductor integrated circuit to operate other than in a normal operation when the monitored voltage waveform does not equal the expected value, wherein the step of monitoring generates a pulse signal from the voltage waveform at the monitoring point; and wherein the determination step finds that reverse engineering is taking place when the time period from a reference time to the time that the pulse signal rises exceeds an allowable range.

2. The protection method as claimed in claim 1, wherein the determination step finds that reverse engineering is taking place when the time for charging the voltage at the monitoring point to a first value exceeds an allowable range.

3. The protection method as claimed in claim 1, wherein the control step operates the semiconductor integrated circuit under dummy conditions.

4. The protection method as claimed in claim 1, wherein the control step stops operation of the semiconductor integrated circuit.

5. The protection method as claimed in claim 1, further comprising: a generation step the expected value from the voltage waveform obtained at the monitoring point when the semiconductor integrated circuit operates in the normal operation.

6. The protection method as claimed in claim 5, further comprising a step of detecting operating temperature of the semiconductor integrated circuit, wherein the generation step generates the expected value based on the detected operating temperature.

7. The protection method as claimed in claim 5, further comprising a step of detecting power voltage of the semiconductor integrated circuit, wherein the generation step generates the expected value based on the power voltage.

8. The protection method as claimed in claim 1, further comprising a step of:

setting whether to make the semiconductor integrated circuit operate other than in a normal operation, wherein the control step operates the semiconductor integrated circuit based on the setting of the setting step.

9. A semiconductor device having a function of protecting a semiconductor integrated circuit from reverse engineering, comprising:

a generator device, configured to generate an expected value from a voltage waveform obtained at a monitoring point during normal operation of the semiconductor integrated circuit;

a monitoring device, configured to monitor the voltage waveform at the monitoring point;

a determining device, configured to determine whether the monitored voltage waveform equals the expected value during normal operation according to the monitoring device; and a control device, configured to control the semiconductor integrated circuit to operate other than in a normal operation when the determining device determines that the monitored voltage waveform does not reach the expected value, wherein the generator device is configured to generate a pulse signal from the voltage waveform at the monitoring point; and wherein the determining device is configured to determine that reverse engineering is taking place when the time period from a reference time to the time that the pulse signal rises exceeds an allowable range.

10. The semiconductor device as claimed in claim 9, wherein the semiconductor integrated circuit comprises a semiconductor memory circuit; and the determining device compares the voltage waveform at the monitoring point with an expected value during a read action or a write action to determine whether reverse engineering is taking place.

11. The semiconductor device as claimed in claim 10, wherein the determining device determines that reverse engineering is taking place when the time it takes the voltage waveform at the monitoring point to reach a first value exceeds a predetermined number of pulses.

12. The semiconductor device as claimed in claim 9, wherein the determining device determines that reverse engineering is taking place when the time it takes the voltage waveform at the monitoring point to reach a first value exceeds a predetermined number of pulses.

* * * * *